United States Patent [19]

Chen et al.

[11] Patent Number: 5,100,871

[45] Date of Patent: Mar. 31, 1992

[54] METHOD FOR PREPARING RARE EARTH-BARIUM-CUPRATE PRE-CERAMIC RESINS AND SUPERCONDUCTIVE MATERIALS PREPARED THEREFROM

[75] Inventors: Kuo-Chun Chen, Carlsbad; Khodabakhsh S. Mazdiyasni, Alpine, both of Calif.

[73] Assignee: General Atomics, San Diego, Calif.

[21] Appl. No.: 441,955

[22] Filed: Nov. 28, 1989

[51] Int. Cl.$^5$ .................... H01B 12/00; H01L 39/12
[52] U.S. Cl. ........................................ 505/1; 505/734; 505/738; 505/735; 505/740; 423/593; 423/604; 423/636; 501/123
[58] Field of Search ............... 505/1, 734, 736, 737, 505/738, 780, 735, 740; 252/518, 521; 423/593, 604, 636; 501/12.3

[56] References Cited

FOREIGN PATENT DOCUMENTS 0051323 2/1989 Japan .................................. 505/734
0008604 11/1988 PCT Int'l Appl. ................. 505/734

OTHER PUBLICATIONS

JPO Abstracts, "Production of Superconductive Material", Hirano et al., 2/13/89, vol. 13, No. 63 App. No. 62-90958, Kokai, #63-256517.
"Dissolution of YBa$_2$Cu$_3$O$_{7-x}$ in Various Solvents", Trolier et al., Am. Ceram. Soc. Bull. 67 (4) 759-62 (Apr. 1988).
"Fabrication of YBa$_2$Cu$_3$O$_{7-x}$ Fibers Using Modified Sol Gel Method", Uchikawa et al., Apr. 1988, from High Temp. Superconductors Symposium.
Nasu et al., Chemistry Letters, The Chemical Society of Japan (1987), Superconducting Y—Ba—Cu—O Films with Tc>70K Prepared by Thermal Decomposition Technique of Y—, Ba—, and Cu— Zethylhexanoates, pp. 2403-2404.
Gross et al., Materials Research Society Symposium Proceedings, vol. 99 (Nov. 30-Dec. 4 1987), Gross et al., "A Versatile New Metalloorganic Spin on Process for Preparing Superconducting Thin Films".
Ozawa et al., Thermochim. Acta, vol. 133, pp. 11-16, "Application of Thermal Analysis to Kinetic Study of Superconducting Oxide Formation" (1988).
Gupta et al., "Preparation of Superconducting Oxide Films from Metal Trifluoroacetate Solution Precursors", ACS Symp. Ser. 377 (Chem. High Temp. Supercond. 2), pp. 265-279 (1988).
Gupta et al., Appl. Physics Letters, vol. 52, No. 24, pp. 2077-2079, "Superconducting Oxide Films with High Transition Temperature Prepared from Metal Trifluoroacetate Precursors" (1988).
Negishi et al., Thermochim Acta, vol. 140, pp. 41-48, "Thermoanalytical Investigation of Yttrium Barium Copper Oxide Superconductor", III, Preparation from Mixed 2-ethylhexanoates of Yttrium, Barium, and Copper (1989).
Nasu et al., J. Meter. Sci. Lett., vol. 7, No. 8, pp. 858-860, "Barium Yttrium Copper Oxide Films with Tc>80K, Prepared by the Pyrolysis of 2-ethylhexanoate" (1988).
Vest et al., J. Solid State Chem., vol. 73 No. (1), pp. 283-285, "Superconducting Films Prepared Using the Metallorganic Decomposition Technique" (1988).

Primary Examiner—William R. Dixon, Jr.
Assistant Examiner—Paul Marcantoni
Attorney, Agent, or Firm—Nydegger & Associates

[57] ABSTRACT

A method of making high T$_c$ 1-2-3 superconductors having perovskite structure using solution techniques is disclosed. The process uses two solvent system to form a resinous pre-ceramic material having a controlled viscosity for facilitating its formation into superconducting articles such as fibers, wires, ribbons, films and the like. The process yields a pre-ceramic which is flexible and which has sufficient structural integrity to withstand normal handling.

17 Claims, 2 Drawing Sheets

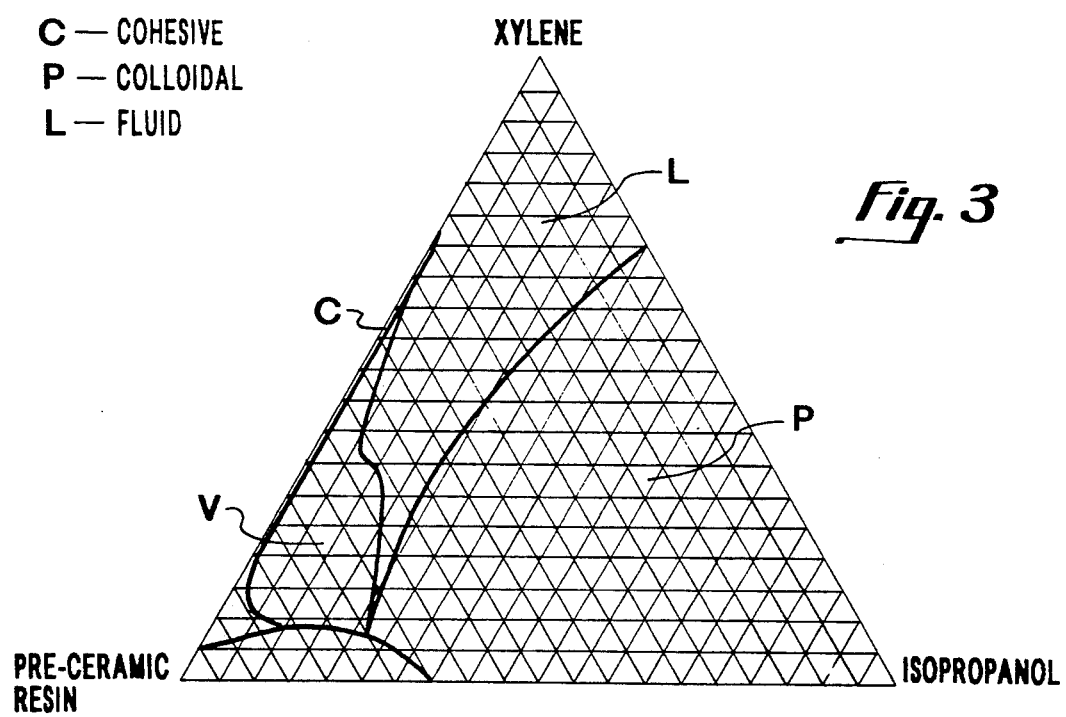

METHOD FOR PREPARING RARE EARTH-BARIUM-CUPRATE PRE-CERAMIC RESINS AND SUPERCONDUCTIVE MATERIALS PREPARED THEREFROM

This invention was made with Government support under Contract N00014-88-C-0714 awarded by the Department of the Navy. The Government has certain rights in this invention.

BACKGROUND OF THE INVENTION

1. Field of the Invention

The present invention relates generally to a process for preparing resinous pre-ceramic materials, also known as superconductive precursors, which can be converted into electrically superconducting ceramic articles having pervoskite structure and the formula $ABa_2Cu_3O_{7-x}$, where A is a rare earth metal and x is from 0.5 to 0. Wires, fibers, films, ribbons, as well as bulk articles can be formed from the pre-ceramic material and converted into superconductive articles. More particularly, this invention relates to the preparation of resinous pre-ceramic materials which are formed from homogenous solutions and which are soluble in nonpolar alcohol solvent solutions. The use of two solvent systems allows for controllable viscosity of the pre-ceramic material and the ability to more easily form articles such as wires, ribbons, fibers, or bulk material which can then be heat treated in a dry oxygen atmosphere to yield superconductive properties.

2. Background of the Invention

The recent discovery of superconductive ceramics which exhibit superconductivity above 77° K (liquid nitrogen boiling temperature) has generated a tremendous search for commercial applications. Particularly promising are the perovskite structured superconductors having the formula $ABa_2Cu_3O_{7-x}$, where A is a rare earth metal and x is from 0.5 to 0. These copper-based superconductors have been found to have a relatively high superconducting transition temperature ($T_c$). This is the temperature at which a material leaves its normal conductivity state and exhibits little or no resistance to electric current. The copper-based superconductors have been known to carry a critical current in excess of $10^5$ amp/cm$^2$ at liquid nitrogen temperature (77° K).

Numerous difficulties have been encountered, however, in achieving a practical usefulness. In order to be truly useful, the superconducting material must be capable of being fabricated into specific shapes, such as wires, fibers, films, coatings and bulk articles. If these materials can be successfully manipulated to achieve a desired article or shape, applications such as microelectronic circuitry, transmission wires, power generators, magnetically levitated trains, magnetic containment fields for storing electricity as well as well as various medical applications become possible.

Various other factors such as proper ceramic density, sufficient capability to handle large currents, good mechanical strength and flexibility also play an important part in making a commercially viable superconducting material.

Thus far, several methods have been used to produce copper-based superconducting ceramics. Solid-state sintering was the first method of producing superconducting materials. This method required the powder oxides and carbonates of the various constituents to be mixed and reacted at high temperatures, followed by a succession of regrinding and refiring steps. Although the solid-state reaction method is found to be very convenient to form a superconductor material, X-ray diffraction analysis shows that these superconductors are usually multiphased, i.e. contain other unreacted compounds such as $BaCuO_2$ and $CuO$. More recently, superconducting ceramics have been prepared by coprecipitation methods using the nitrate and/or other inorganic salt forms of the individual constituents and precipitated out of solution to the corresponding hydroxide/oxide containing carbonate forms. The precipitated mass is heated to remove water and anions impurities and then heated and ground repeatedly in the same manner as the solid-state reaction method. The advantage of this method over the solid-state method is that if the stoichiometry of the desired single phase of the superconductor is known, as it is for $YBa_2Cu_3O_{7-x}$ (the composition 1-2-3 compound), then the added chemical step ensures that the constituents will be formed and that other "impurity" phases will not be formed.

Two other known forms of the coprecipitation method have been tried, namely the citrate and oxalate methods. In each case, the nitrates of the constituent powders are first dissolved in solution. Then, in the citrate method, citric acid and ethylene glycol are used to initiate the precipitation instead of $Na_2CO_3$ or $K_2CO_3$. In the oxalate method, potassium oxalate is used. These methods must be monitored closely and in the oxalate method the pH must be strictly monitored to avoid formation of double salts.

The product of both the solid state processes as well as the coprecipitation methods is typically a powder or sintered spongy compact, which are difficult to manufacture into applications such as wires, fibers, films or coatings.

A solution process has been used for fabricating superconducting ceramics. This process comprised the steps of preparing a solution containing organometallic precursor molecules wherein the relative molar ratios of said organometallic precursor molecules are in the appropriate amounts for producing electrically superconducting ceramic material; treating said mixture of organometallic precursor molecules to form a viscous dielectric material; shaping said viscous dielectric material into a particular shape; and heating the shaped viscous material for a sufficient time and at a sufficient temperature to convert said viscous material into an electrically superconducting ceramic article.

This example also discloses the use of a sol-gel process to fabricate $YBa_2Cu_3O_{7-x}$ superconducting fibers. This process involves controlling the hydrolysis and polymerization of metal alkoxides to form primarily chain-like metaloxane polymers which are then shaped into desired fibers and heat treated to form a superconducting material. The fibers produced from this process showed the superconducting transition temperature to be about 90° K. This application also discloses the use of 2-ethyl-hexanoic acid (2-EHA) as an organic acid modifier which reduces the hydrolysis and polymerization rates of the metal alkoxides, thus preventing precipitation. Once the yttrium, barium and copper alkoxide solutions were fully reacted, the solvent was removed and the solutions became viscous after a few hours due to the hydrolysis and polymerization of the alkoxides.

Up to the present time, however, no method has disclosed the use of a dual solvent system for the preparation of superconducting materials. The advantages of such a system allows for enhanced control over the formation of a viscous pre-ceramic which can be shaped and heat treated to form the superconductive state.

SUMMARY OF THE INVENTION

The instant invention concerns a method of making superconducting articles such as fibers, wires, ribbons, films, bulk solids and the like using a precipitate process which employs specific parameters for hydrolysis and a second solvent system to effectuate control of the pre-ceramic viscosity.

More particularly, this invention relates to formation of a pre-ceramic resinous material, also known in the art as a superconductor precursor, which remains in the stable dry state at ambient temperatures, and which can be softened or dissolved in nonpolar solvents to achieve the desired viscosity for processing into shapes.

Additionally, one embodiment of this invention concerns the method of producing the pre-ceramic resinous material. Another embodiment concerns the structure and physical state of the pre-ceramic resinous material. A further embodiment relates to a method of producing flexible and mechanically strong pre-ceramic articles such as thin fibers, wires and the like which are capable of being made superconductive. The superconductive transition temperature $T_c$ of these materials is about 84° K–89° K with a superconductive onset temperature of about 87° K–91° K.

More particularly, this invention concerns a method of making a pre-ceramic material capable of being converted into an electrically superconductive ceramic material having perovskite structure comprising the steps of: i) mixing together respective solutions of a rare earth metal alkoxide, an alkaline earth metal alkoxide and an organic copper salt and refluxing the combined solution obtained therefrom at temperatures of about 40° C. to about 82° C. for a time sufficient to obtain a maximum amount of precipitate; ii) hydrolyzing the precipitate in a first solvent system comprising a water-/alcohol solution under heat to substantially dissolve the precipitate; iii) removing sufficient solvent to obtain the desired state of the thus formed pre-ceramic resin material; iv) mixing the pre-ceramic resin material with a second solvent system comprising a nonpolar solvent; and v) removing sufficient solvent to control the resultant flow properties of the pre-ceramic resin material.

Yttrium, barium, and copper are the preferred constituents of the final superconductive material and they are generally present in stoichiometric amounts in the final composition, although non-stoichiometric amounts are contemplated, e.g. the final composition may have $Y_2BaCuO_5$ present where y is from 0.005 to 0.40. However, as will be later described, the instant method can be applied using a variety of rare earth metals, as well as partial substitution of other alkaline earth metals for barium.

Thus, the instant invention also contemplates a method of making a yttrium/barium/cuprate superconducting material having the structure $YBa_2Cu_3O_{7-x}$.

DETAILED DESCRIPTION OF THE INVENTION

Figure 1:
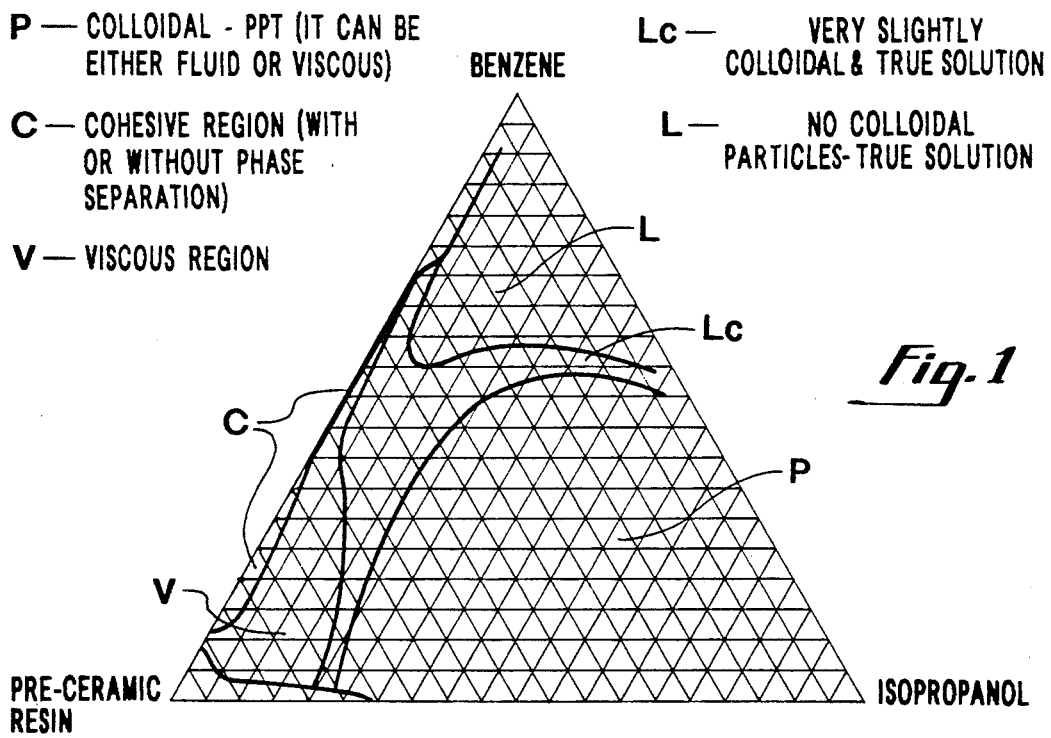

In preparing the superconducting materials of the instant invention, several factors are important to the quality of the final product. Stoichiometry, the preparation of the pre-ceramic, the sintering temperature, the use of oxygen in the process and the rate of cooling are five such factors. These factors will affect the transition temperature, $T_c$, the transition width, the room-temperature resistance as well as the phase purity of the final 1-2-3 orthorhombic crystal structure. A slight change in stoichiometry, for example, from $Y_1Ba_2Cu_3O_{7-x}$ to $Y_{1.05}Ba_{1.8}Cu_{3.0}O_{7-x}$ has been shown to decrease the zero resistance transition temperature, $T_c$, from 90° K to 60° K, and increase the resistive transition width from 1° K to 5° K. For this reason, solution condensed phase techniques may be favored.

The sintering and/or annealing processes must also be carried out with care. Temperatures may vary according to the particular material, but sintering is carried out at temperatures of from about 800° to about 1000° C. for about eight to twenty-four hours, followed by annealing at about 360° C. to about 500° C. for about four to about forty-eight hours. This is performed under a dry oxygen atmosphere. The high temperature sintering is generally necessary to ensure that the correct (crystalline) structure is formed.

As previously discussed, the instant process of preparing high $T_c$ perovskite type (1-2-3) superconductors has a distinct advantage of the prior art coprecipitate or solution methods due to the ability to form dry pre-ceramic resin which can be stored until needed, and then softened or dissolved in a nonpolar solvent or a nonpolar/alcohol solution to the desired viscosity. Thus, the products of this invention are stable and do not undergo viscosity changes over time as the current sol-gel or coprecipitate methods. In the sol-gel methods, the time for drawing a fiber from the resin must be chosen within a narrow window of time and must be balanced with the sol to gel transition Once the gel sets up, it is difficult to form into the desired shape. The instant invention clearly overcomes this problem since the pre-ceramic resin can be stored and redissolved at anytime at will to obtain the desired viscosity.

One embodiment of the inventive process involves the preparation of high $T_c$ 1-2-3 superconductors of the perovskite type, having the general formula $ABa_2Cu_3O_{7-x}$, where A is a rare earth metal and x is from 0.5 to 0. Thus, a superconductive ceramic having perovskite structure of the above formula can be made by the process comprising: i) refluxing a rare earth metal alkoxide/alkyl ($C_{2-6}$) alcohol (dry) solution with an alkaline earth metal alkoxide/alkyl ($C_{2-6}$) alcohol (dry) solution under inert atmosphere; ii) adding to this solution an acidic organic copper salt/alkyl ($C_{2-6}$) alcohol solution to obtain a precipitate while continuing to reflux; iii) maintaining the precipitate at about 20° C. to about 82° C. for up to two hours under inert atmosphere; iv) adding a water/alkyl ($C_{2-6}$) alcohol solution in amounts of about two to about ten equivalents of water per mole of rare earth metal alkoxide to obtain a homogenous dark green solution; v) removing the solvent to obtain a viscous or dry pre-ceramic resinous material; vi) dissolving or softening the pre-ceramic resinous material in a nonpolar solvent to obtain a desired viscosity; vii) forming a desired shape from the viscous pre-ceramic material; viii) slowly heating the shaped pre-ceramic article in a dry oxygen about eight to about twenty-four hours; and ix) annealing the article at about 360° C. to about 500° C. for about four to about forty-eight hours to form a superconductive article having perovskite structure.

The rare earth metal "A" in the aforementioned structure can be any of the rare earth metals known to be useful in superconducting materials. Non-limiting examples include yttrium, erbium, eurobium, gadolinium, holmium, lutetium, semarium and dysprosium. Yttrium is preferred.

Although barium is the preferred alkaline earth metal, at least partial substitution with other alkaline earth metals such as strontium, calcium and alkali metals such as potassium are contemplated. Mixtures are also contemplated.

The alkoxides of the rare earth metals and alkaline earth metals may be selected from the group consisting of ethoxides, propoxides, isopropoxides, butoxides, pentoxides, and mixtures thereof. Thus, yttrium ethoxide, yttrium propoxide, yttrium isopropoxide, yttrium butoxide as well as yttrium pentoxide are deemed useful. Yttrium isopropoxide is preferred. Similarly, barium ethoxide, barium propoxide, barium isopropoxide, barium butoxide and barium pentoxide are contemplated. Barium isopropoxide is preferred.

The alkoxides are present in corresponding alkyl ($C_{2-6}$) alcohol solutions. For example, ethanol, propanol, isopropanol, butanol, pentanol and hexanol are examples of useful alcohols. The preferred alcohol is isopropanol. The alcohol should be dry.

The acidic organic copper salt is also present in an alkyl alcohol ($C_{1-6}$) solution prior to its incorporation with the rare earth and alkaline earth metal alkoxide/alcohol solutions. The organic copper salt most preferred is copper ethylhexanoate, although other acidic organic copper salts are useful. In addition to the copper ethylhexanoate, a member selected from the group consisting of copper trifluoroacetate, copper trichloroacetate, copper difluoroacetate, copper dichloroacetate, copper monofluoroacetate, and copper monochloroacetate may be added in sufficient quantities to prevent the formation of undesirable $BaCO_3$, by favoring the formation of $BaX_2$ where X is chlorine or fluorine. Copper trifluoroacetate is preferred. However, the copper trifluoroacetate should only be used in amounts necessary to generate $BaF_2$. For example, the copper ethylhexanoate to copper trifluroacetate ratio can be 2:1, 7:1, 10:1 etc.

The refluxing of step i) is carried out at the boiling point of the solution under nitrogen for about one to two hours. Other inert atmospheres such as helium or argon may be used. At this point the organic copper salt (copper ethylhexanoate)/alcohol (isopropanol) solution was added and refluxing was continued. A green precipitate was formed and the reaction was maintained at about 20° C. to about 82° C. for up to two hours under inert (nitrogen) atmosphere.

Step iv) involves the addition of a water/alkyl ($C_{1-6}$) alcohol solution The preferred alcohol is isopropanol. This solution is added in critical amounts of about two to about ten equivalents of water per mole of rare earth metal alkoxide (e.g. yttrium isopropoxide). The precipitate dissolves, forming a dark green homogenous solution, which is stirred from one to twenty-four hours at temperatures ranging from 40° C. to 80° C. At this point, the solvent is removed by rotary evaporation to obtain a dry pre-ceramic resinous mass. The dry mass was then dissolved in a nonpolar solvent or preferably in a nonpolar solvent/alkyl ($C_{1-6}$) alcohol solution. The preferred nonpolar solvents are hexane, benzene, ethylbenzene, hexyl-benzene, toluene, xylene and mixtures thereof. Other alcohols may be useful. The most preferred nonpolar solvents are benzene, toluene and xylene. The preferred alcohols are those mentioned above, with isopropanol being most preferred.

The ratio of pre-ceramic resin to nonpolar solvent/alcohol solution is about 15:1 to about 1.5:1 by weight. The preferred combinations are benzene/isopropanol, toluene/isopropanol and xylene/isopropanol.

It has been determined that the nonpolar/alcohol solution of pre-ceramic resin comprising one of the following compositions is particularly good for the drawing of fibers:

A)
0-17% alcohol (isopropanol) 2-55% benzene 28-98% pre-ceramic resin material; or B)
0-14.9% alcohol (isopropanol)
2-65% toluene
20-98% pre-ceramic resin material; or C)
0-18% alcohol (isopropanol)
7-60% xylene
16-93% pre-ceramic resin material.

Figure 2:
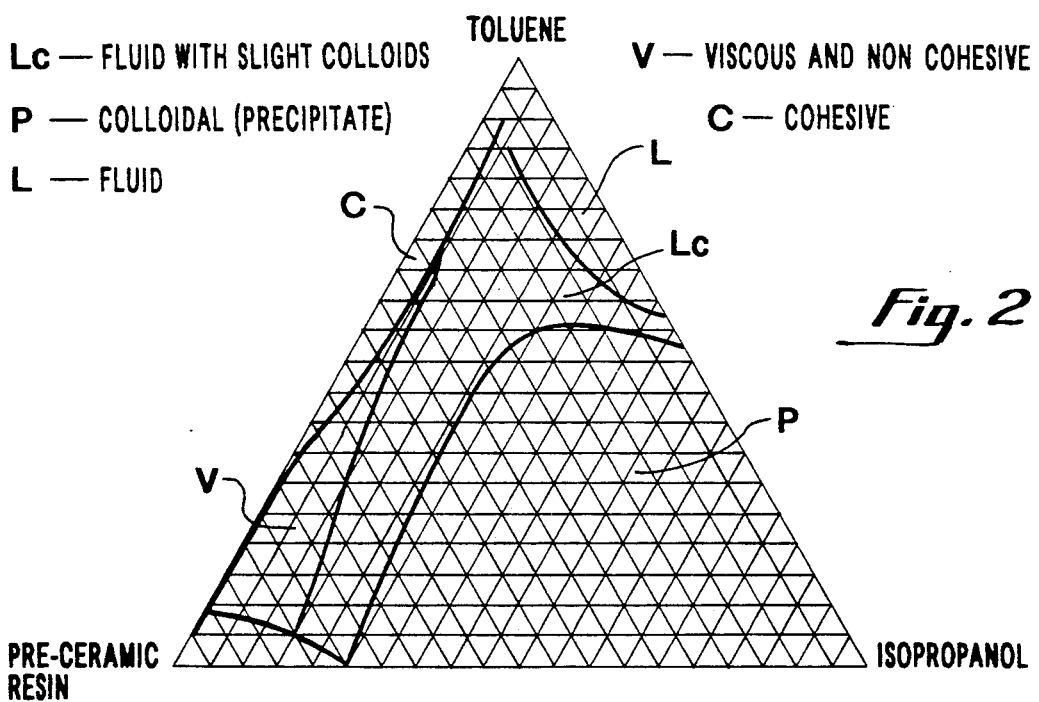

These are among numerous possible combinations which may be used. Suitable viscosities can be easily adjusted by using different solvent combinations and different ratios. There are special cases where the fiber drawing range can be extended to 75% weight of either benzene, toluene or xylene. This can be seen in the tie-lines between benzene-resin, toluene-resin and xylene-resin as evidenced in FIGS. 1, 2 and 3 respectively. These figures are phase graphs of the drawing solutions indicating the various phases, e.g. liquid colloidal, viscous, cohesive, etc. as a function of nonpolar solvent type and weight percent of the pre-ceramic nonpolar solvent and isopropanol components.

Another aspect of the instant invention concerns a pre-ceramic resinous material capable of being converted into an electrically superconductive ceramic material having perovskite structure and conforming to the formula $ABa_2Cu_3O_{7-x}$ where A is a rare earth metal and x is from 0.5 to 0, said pre-ceramic resinous material having approximate stoichiometric amounts of rare earth metal alkoxide, barium alkoxide, and organic copper salt present and being soluble in both water/alcohol solution and nonpolar solvent/alcohol solutions.

EXAMPLE

Preparation of Starting Materials

A yttrium isopropoxide/isopropanol 0.01M–0.3M solution was prepared by reacting a yttrium metal chip in dry isopropanol and a small amount of $HgCl_2$ as a catalyst and refluxing at about 82° C. until completion of the reaction (about three days). The mixture was filtered to obtain a clear solution.

A barium isopropoxide/isopropanol 0.01M–0.3M solution was prepared by placing barium metal in dry isopropanol, then filtered and stored in a nitrogen dry box.

A copper ethylhexanoate/isopropanol 0.01M–0.3M solution can be prepared by mixing copper ethylhexanoate in dry isopropanol. The copper ethylhexanoate was commercially purchased, however.

A copper trifluroacetate can be prepared by reacting copper methoxide or copper ethoxide with trifluroacetic acid.

Preparation of Pre-Ceramic Resin

A precalculated volume of barium isopropoxide/isopropanol solution was pipetted into a round bottom flask and the appropriate volume of yttrium isopropoxide/isopropanol was added. Stoichiometric amounts were used (to give the final ceramic composition $YBa_2Cu_3O_{7-x}$). The solution was refluxed at its boiling point under nitrogen for about two hours. The required amount of copper ethylhexanoate $(Cu(EH)_2)$ was added. A green precipitate formed and was kept at 20° C. to 80° C. for two hours under dry nitrogen. A water/isopropanol solution using ten equivalents of water per mole of yttrium isopropoxide was added and the green precipitate gradually dissolved forming a dark green homogenous solution. The solution was stirred for about four hours at a temperature of about 60° C. This solution was concentrated on a rotary evaporator to obtain a dry mass. This mass was dissolved in a benzene/isopropanol solution in a ratio of 10:1 by weight and concentrated by removing the solvent on a rotary evaporator. A dry resin-like mass was obtained. The dry pre-ceramic mass was redissolved in a benzene/isopopanol solution having 3% isopropanol, 20% benzene and 77% resin. Fibers were drawn by hand by dipping in a glass rod and drawing the viscous solution. The fibers solidified to a mechanically strong structure and did not easily break on handling yet they had excellent flexibility. No brittleness was present.

The fibers were converted to yttrium barium cuprate superconducting fibers by heat treating in dry oxygen slowly from 800° C. to 1000° C., sintered for twenty-four hours and annealed at 360° C. to 500° C. for forty-eight hours.

Additional fibers made using a mixture of copper ethylhexanoate and copper trifluroacetate (2:1) required heat treatment in a water-containing atmosphere from 500° C. to 900° C. for six to twenty-four hours prior to switching to a dry oxygen atmosphere at 900° C. to 1000° C. for four to twenty-four hours.

The $T_c$ of the fibers were tested using the standard fourprobe technique. Silver epoxy (paste) was used for electrical contacts. A small ac current (0.1 mA) was supplied by an ac power supply. The $T_cR=0$ was found to be 84° K–87° K with an onset of 87° K–91° K.

While the particular method for preparing pre-ceramic resins as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

We claim:

1. A method of making a pre-ceramic material capable of being converted into an electrically superconductive ceramic material having the general formula $ABa_2CU_3O_{7-x}$ where A is a rare earth metal and x is from 0 to 0.5, which comprises the steps of:

refluxing stoichiometric amounts of a first solution comprising a rare earth isopropoxide and barium isopropoxide in isopropanol under a dry, inert atmosphere;

adding to said first solution a stoichiometric amount of a second solution comprising copper ethylhexanoate in isopropanol;

refluxing said first and second solutions to obtain a precipitate;

adding to said precipitate a quantity of a first solvent comprising water and isopropanol having from about 2 to 10 equivalents of water per mole of rare earth isopropoxide to hydrolyze said precipitate and to sufficiently dissolve said precipitate to produce a substantially homogeneous solution;

concentrating said homogeneous solution by removing a sufficient amount of said first solvent to produce a viscous or dry pre-ceramic resinous material;

softening or dissolving the pre-ceramic resinous material in a second solvent comprising a nonpolar solvent or alcohol and a nonpolar solvent to obtain a desired viscosity; and forming the viscous pre-ceramic material into the desired product shape.

2. A method as recited in claim 1 wherein said rare earth metal is selected from the group consisting of yttrium, erbium, europium, gadolinium, holmium, lutetium, samarium, dysprosium, and mixtures thereof.

3. A method as recited in claim 1 wherein said rare earth metal comprises yttrium.

4. A method as recited in claim 1 wherein said nonpolar solvent is selected from the group consisting of hexane, benzene, ethyl-benzene, hyexyl-benzene, toluene, xylene and mixtures thereof.

5. A method as recited in claim 1 wherein up to 50 mole% of said copper ethylhexanoate is replaced with copper trifluoroacetate.

6. A method as recited in claim 1 wherein said alcohol is selected from the group consisting of ethanol, propanol, isopropanol, butanol, pentanol, hexanol and mixtures thereof.

7. A method as recited in claim 1 wherein said nonpolar/alcohol solvent solution is selected from the group consisting of benzene/isopropanol, toluene/isopropanol, xylene/isopropanol and mixtures thereof.

8. A method as recited in claim 1 wherein said viscous pre-ceramic material is formed into a product shape by drawing the material into fibers.

9. A method of making an electrically superconductive ceramic material having the general formula $ABa_2CU_3O_{7-x}$ where A is a rare earth metal and x is from 0 to 0.5, which comprises the steps of:

refluxing stoichiometric amounts of a first solution comprising a rare earth isopropoxide and barium isopropoxide in isopropanol under a dry, inert atmosphere;

adding to said first solution a stoichiometric amount of a second solution comprising copper ethylhexanoate in isopropanol;

refluxing said first and second solutions to obtain a precipitate;

adding to said precipitate a quantity of a first solvent comprising water and isopropanol having from about 2 to 10 equivalents of water per mole of rare earth isopropoxide to hydrolyze said precipitate and to sufficiently dissolve said precipitate to produce a substantially homogeneous solution;

concentrating said homogeneous solution by removing a sufficient amount of said first solvent to produce a viscous or dry pre-ceramic resinous material;

softening or dissolving the pre-ceramic resinous material in a second solvent comprising a nonpolar solvent or alcohol and a nonpolar solvent to obtain a desired viscosity;

forming the viscous pre-ceramic material into the desired product shape; and calcining the product shape for a sufficient time at a sufficient temperature in an oxygen containing atmosphere to produce a superconductive ceramic material having a $T_c$ onset of about 87° C. to 91° C.

10. A method as recited in claim 9 including the further step of annealing said ceramic superconductive material at a lower temperature following said calcining.

11. A method as recited in claim 9 wherein said rare earth metal is selected from the group consisting of yttrium, erbium, europium, gadolinium, holmium, lutetium, samarium, dysprosium, and mixtures thereof.

12. A method as recited in claim 9 wherein said rare earth metal comprises yttrium.

13. A method as recited in claim 9 wherein said nonpolar solvent is selected from the group consisting of hexane, benzene, ethyl-benzene, hexyl-benzene, toluene, xylene and mixtures thereof.

14. A method as recited in claim 9 wherein up to 50 mol % of said copper ethylhexanoate is replaced with copper trifluoroacetate.

15. A method as recited in claim 9 wherein said alcohol is selected from the group consisting of ethanol, propanol, isopropanol, butanol, pentanol, hexanol and mixtures thereof.

16. A method as recited in claim 9 wherein said nonpolar/alcohol solvent solution is selected from the group consisting of benzene/isopropanol, toluene/isopropanol, xylene/isopropanol and mixtures thereof.

17. A method as recited in claim 9 wherein said viscous pre-ceramic material is formed into a product shape by drawing the material into fibers.

* * * * *